(12) United States Patent
Jhe et al.

(10) Patent No.: US 6,476,381 B1
(45) Date of Patent: Nov. 5, 2002

(54) NANO-PATTERN LITHOGRAPHIC FABRICATION USING PULLED MICRO-PIPETTE AND METHOD THEREOF

(75) Inventors: Won Ho Jhe, Sunkyung Apt. 5-1505, Daechi-Dong, Kangnam-Ku, Seoul (KR); Ki Hyun Kim, Seoul (KR)

(73) Assignee: Won Ho Jhe, Seoul (KR)

( * ) Notice: Subject to any disclaimer, the term of this patent is extended or adjusted under 35 U.S.C. 154(b) by 0 days.

(21) Appl. No.: 09/443,051

(22) Filed: Nov. 18, 1999

(51) Int. Cl.⁷ .................................................. H01J 3/14
(52) U.S. Cl. ....................................... 250/234; 250/576
(58) Field of Search .................................. 250/234, 202, 250/559.29–559.32, 559.13, 576, 573, 574, 221; 356/615, 621, 246, 440, 427, 428, 436; 222/1; 427/91

(56) References Cited

U.S. PATENT DOCUMENTS 4,880,496 A  *  11/1989  Nebenzahl et al. ........... 216/93
5,141,871 A  *  8/1992  Kureshy et al. ............... 436/47

* cited by examiner

Primary Examiner—Frank G. Font
Assistant Examiner—Thanh X. Luu
(74) Attorney, Agent, or Firm—Chien-Wei (Chris) Chou; Oppenheimer Wolff & Donnelly LLP

(57) ABSTRACT

A nano-pattern lithographic fabrication apparatus for fabricating a fine pattern using a pulled micro-pipette is disclosed. This apparatus includes a container for receiving a certain solution therein, a container controlling unit for controlling the movement of the container and an ejection of the solution filled in the container, a sample moving unit for supporting and moving the sample, a detector for detecting a distance between the container controlling unit and the sample moving unit, and a controlling unit for receiving a detection signal from the detector and controlling the movement of the container and the sample moving unit and a distance therebetween.

11 Claims, 2 Drawing Sheets

NANO-PATTERN LITHOGRAPHIC FABRICATION USING PULLED MICRO-PIPETTE AND METHOD THEREOF

BACKGROUND OF THE INVENTION

1. Field of the Invention

The present invention relates to a nano-pattern lithographic fabrication using a micro-pipette and a method thereof, and in particular to a nano-pattern lithographic fabrication using a pulled micro-pipette and a method thereof which is capable of forming a fine pattern using the pulled micro-pipette in a probe type, by inserting a certain solution in the micro-pipette, accessing an end portion of the micro-pipette to a surface of a certain sample, and ejecting the solution on the surface of the sample.

2. Description of the Background Art

Recently, as circuit parts are intensively integrated, the sizes of electronic and electrical products have decreased. For example, a memory circuit such as a DRAM or a computation processing circuit such as a CPU, etc., are known. As the integrity of the above-described circuits have enhanced, the size of the product has become more compact. In order to increase the integrity of the circuit, the line widths of the circuits in the DRAM and CPU must be decreased by using a nano-pattern lithographic fabrication technique.

The above-described nano-pattern lithographic fabrication technique is used when manufacturing a semiconductor as well as a storing medium. For example, in the case of a disk storing medium such as a hard disk and an optical disk, the line width of a fine pattern formed on the surface of a disk is 200 to 500 nm which is obtained based on a nano-pattern lithographic fabrication technique.

The above-described nano-pattern lithographic fabrication technique is important for manufacturing a micro-actuator which is an ultra small electrical mechanical structure. As the size of products decreases, an applicable range of the nano-pattern lithographic fabrication technique will significantly widen.

The conventional nano-pattern lithographic fabrication technique will be explained as below.

When fabricating a desired pattern on a sample, a mask having the same pattern as the pattern which will be formed must be previously prepared. In the thusly fabricated mask, the pattern which does not transmit light on a glass substrate is formed.

After the mask is manufactured, the desired pattern is prepared for the sample to be fabricated. The sample is hardened by uniformly coating a photoresist (PR) on the sample and heating the PR using an oven.

The mask is covered to have a certain distance from the PR-hardened sample using a distance adjusting apparatus, and then light is scanned onto the mask. Thereafter, the portion through which light is transmitted and the portion through which light is not transmitted are formed on the PR of the sample. The light-exposed PR portion is differently shown. Next, the exposed PR portion is removed using a developing liquid for thereby exposing a substrate to the outside. The thusly exposed substrate is etched using an etchant which does not chemically react with the PR but chemically reacts with the substrate. The thusly exposed substrate is etched. Next, the PR portion remaining on the substrate is removed for thereby forming the pattern on the sample.

However, in the conventional nano-pattern lithographic fabricating apparatus and the method thereof, an expensive controlling apparatus and a light source generating apparatus are required for aligning the mask on the sample with a certain distance. In addition, in order to form a desired pattern, complicated controlling processes are required. Also, since light from the light source generating apparatus is diffracted when passing through the pattern formed on the mask, it is impossible to decrease the line widthes of the pattern formed on the sample by half of the wavelength of the incident light. In addition, even when a light source having a small wavelength such as X-ray or electron beam, the mask must be manufactured to have a fine pattern based on an accuracy better than the line width of the pattern fabricated on the sample.

The lithography method based on the conventional electron beam is used for forming a test pattern and mask. Generally, it is impossible to fabricate the line widths of the pattern below 100 nm due to back scattering phenomenon as an acceleration energy of an electron beam is increased.

Therefore, in the conventional nano-pattern lithographic fabrication method such as a photo lithography method has a limit for decreasing the line widths of the fine pattern of 100 nm.

SUMMARY OF THE INVENTION

Accordingly, it is an object of the present invention to provide a nano-pattern lithographic fabrication for fabricating a fine pattern using a pulled micro-pipette.

It is another object of the present invention to provide a method for fabricating a fine pattern using a pulled micro-pipette.

In order to achieve the above objects, there is provided a nano-pattern lithographic fabrication using a pulled micro-pipette according to the present invention which includes a container for receiving a certain solution therein, a container controlling unit for controlling the movement of the container and an ejection of the solution filled in the container, a sample moving unit for supporting and moving the sample, a detector for detecting a distance between the container controlling unit and the sample moving unit, and a controlling unit for receiving a detection signal from the detector and controlling the movement of the container and the sample moving unit and a distance therebetween.

In order to achieve the above objects, there is provided a nano-pattern lithographic fabrication method using a pulled micro-pipette according to the present invention which includes the steps of accessing a container having a certain solution therein to a surface of a sample, maintaining a certain distance between an end portion of the container and a surface of a sample, and moving a sample moving unit which supports and moves the sample and ejecting the solution onto the sample for thereby fabricating a desired pattern on the sample.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention relates to a nano-pattern lithographic fabrication apparatus using a pulled micro-pipette and a method thereof which is capable of fabricating a fine pattern having a line width below 100 nm. The nano-pattern lithographic fabrication using the pulled micro-pipette and a method thereof will be explained with reference to the accompanying drawings.

Figure 1:
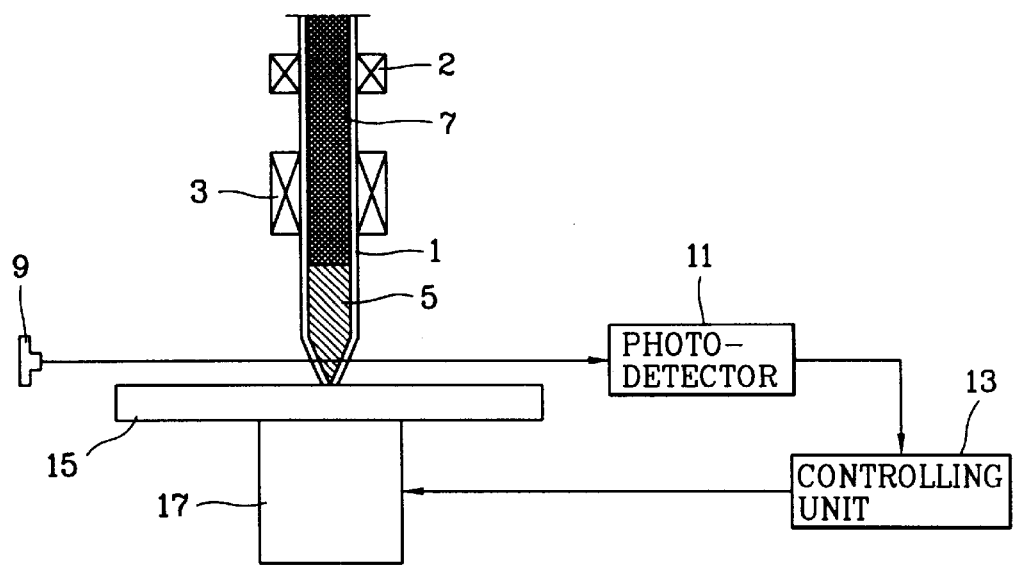
FIG. 1 is a schematic view illustrating a nano-pattern lithographic fabrication apparatus according to the present invention; , FIG. 2*i* a detailed schematic view illustrating of pulled micro-pipette and the sample according to the present invention.

FIG. 1 is a schematic view illustrating a nano-pattern lithographic fabrication apparatus using a pulled micro-pipette according to the present invention which includes a micro-pipette 1 for receiving a solution 5 such as a photo resist (PR), an etchant, etc. therein, a first fine displacement generating unit 2 for vibrating the micro-pipette 1, an optical fiber 7 inserted in the micro-pipette 1, a second fine displacement generating unit 3 for ejecting the solution in the micro-pipette 1 by generating a certain displacement at the optical fiber by pressurizing the optical fiber 7, a sample 15 onto which the solution 5 is covered from the micro-pipette 1, a sample moving stand 17 for movably supporting the sample 15, a laser 9 for outputting a laser beam at an end portion of the micro-pipette 1 for detecting a distance that an end portion of the micro-pipette 1 accesses the sample 15, an photo-detector 11 for detecting a laser beam passed through the end portion of the micro-pipette 1, and a controlling unit 13 for receiving a signal detected by the photo-detector 1 and controlling the movement and distance of each elements.

Figure 2:
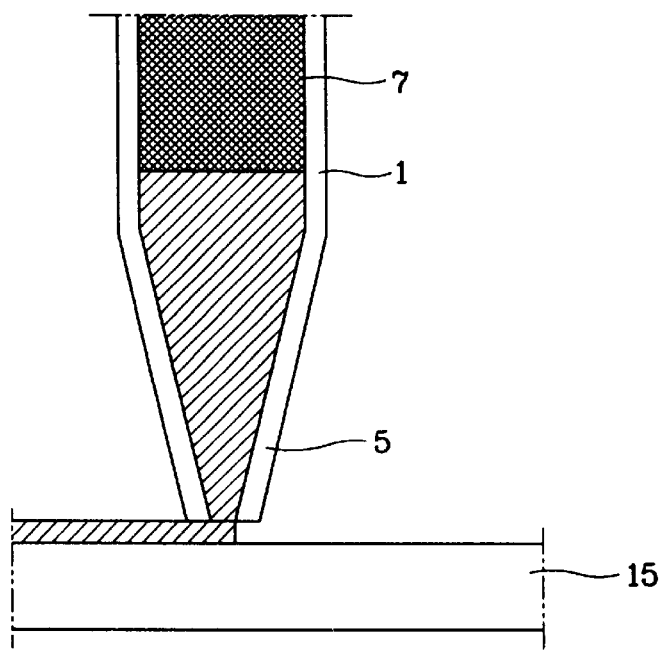

FIG. 2*i* a detailed schematic view illustrating of pulled micro-pipette and the sample. As shown therein, an end portion of the micro-pipette 1 is positioned at a certain distance from the sample 15, the second fine displacement generating unit 2 pressurizes the micro-pipette 1 for thereby ejecting the solution 5 from the micro-pipette 1.

The process for fabricating a fine pattern based on a nano-pattern lithographic fabrication apparatus according to the present invention will now be explained.

The pipette 1 is heated and pulled so that a fine pattern having a desired line width (for example, below about 100 nm) of the pattern is formed for thereby manufacturing a pulled micro-pipette having a diameter of 10 to 100 nm. A solution (for example, photoresister(PR) or etchant) is filled in the micro-pipette 1, and the micro-pipette 1 is installed to the nano-pattern lithographic fabrication apparatus.

In order to check whether an end portion of the micro-pipette 1 is accessed to the sample 15 by a certain distance, an alternating current (AC) is supplied to a first displacement generating unit 2 disposed on the upper portion of the micro-pipette 1, and the micro-pipette 1 is vibrated based on an amplitude of 10–100 nm and a resonant frequency of the micro-pipette 1.

When the end portion of the micro-pipette 1 is accessed to the surface of the sample 15 at a certain distance, the amplitude of the vibration of the micro-pipette 1 is decreased within about 10 nm and is detected by the photo-detector 11 which detects a laser beam passed through the end portion of the micro-pipette 1.

In a state that the end portion of the micro-pipette 1 is accessed to the surface of the sample at a certain distance, when the photo-detector 11 detects the laser beam from the laser diode 9 and outputs a electrilcal signal to the controlling unit 13, the controlling 13 outputs the control signals between the first displacement generating unit 2 and the sample moving support 17 for thereby forming a control loop, so that the distance is maintained between the sample 15 and the end portion of the micro-pipette 1.

Therefore, when the distance is maintained between the end portion of the micro-pipette 1 and the surface of the sample 15, the second fine displacement generating unit 3 pressurizes the micro-pipette 1 in accordance with a control of the controlling unit 13, so that the solution 5 is ejected to the sample 15.

Namely, in order to fabricate the desired pattern on the sample 15, the sample 15 disposed on the sample moving support 17 is moved as the sample moving support 17 is moved. When the end portion of the micro-pipette 1 is positioned at a position on the sample 15, the second fine displacement generating unit 3 is operated for thereby ejecting the solution, so that the desired pattern is formed on the sample 15. Here, the sample moving support 17 is moved by a displacement generating unit (not shown) such as a PZT or Transducer.

In order to form the desired pattern on the sample 15, each block is controlled by the controlling unit 13. Namely, the controlling unit 13 outputs a scanning signal to the displacement generating unit (not shown) attached at the sample moving support 17. In order to form a previously stored pattern (or desired pattern), when the micro-pipette 1 is positioned at the portion in which the pattern is formed on the sample 15, a control signal is outputted to the second fine displacement generating unit 3 for ejecting the solution 5 for thereby forming a fine pattern on the sample 15.

Figure 3A:
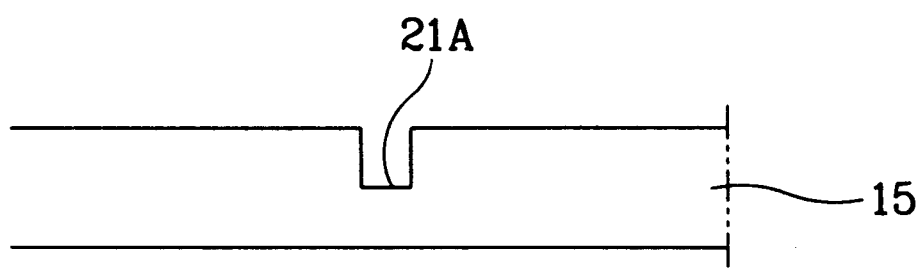
FIGS. 3A and 3B are cross-sectional views illustrating a pattern fabricated on a sample according to the present invention.
Figure 3B:
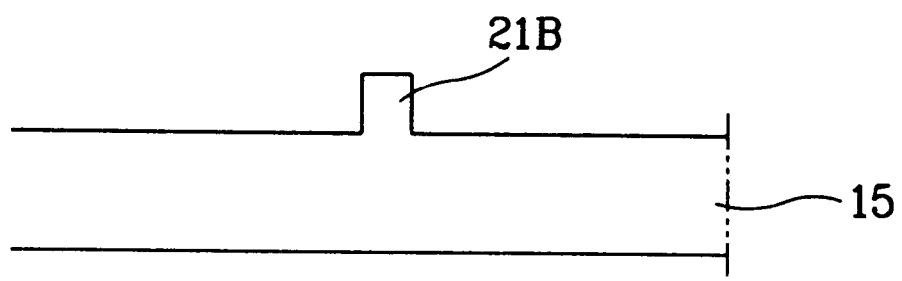

As shown in FIG. 3A, the shape of the fine pattern formed on the sample 15 according to the present invention may be a trench shape pattern 21A or a ridge shape pattern 21B. The above-described shapes of the pattern are determined by the kinds of the solution filled in the micro-pipette 1.

Therefore, in the nano-pattern lithographic fabrication apparatus using the pulled micro-pipette according to the present invention, since the pattern is formed by accessing the pulled micro-pipette having a sharp tip to the surface of the sample within 10 nm, it is possible to fabricate the desired pattern with the line width of 10 nm.

In addition, the nano-pattern lithographic fabrication apparatus using the pulled micro-pipette according to the present invention does not have to use a PR coating process and a developing process, an apparatus in accordance with the conventional art for aligning the mask and an expensive light source such as an X-ray apparatus and an optics for decreasing the line width of the pattern.

In the above, the apparatus for fabricating the line widths of the pattern by 100 nm below was described. However, if the diameter of the pulled micro-pipette is decreased less than the above-mentioned, it is possible to fabricate a pattern with more narrow line width.

Even though the above-mentioned embodiment is described about fabricating a desired pattern on the sample, it is possible to manufacture a mask using the above-mentioned nano-pattern lithographic fabrication apparatus as an another embodiment.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A nano-pattern lithographic fabrication apparatus, comprising:
- a container for receiving a nano-pattern generating solution therein;
- a sample on which a pattern is formed by the solution;
- a container controlling unit for controlling the movement of the container and ejecting the nano-pattern generating solution filled in the container on the sample, wherein said container controlling unit comprises:
  - a first displacement generating unit for vibrating the container at a resonant frequency; and
  - a second displacement generating unit for pressurizing the container thereby ejecting the nano-pattern generating solution therefrom;
- a sample moving unit for supporting and moving the sample;
- a detector for detecting a distance between a dispensing end portion of the container and a surface of the sample; and
- a controlling unit for receiving a detection signal from the detector and controlling the movement of the container and the sample moving unit and a distance there between.

2. The apparatus of claim 1, wherein said nano-pattern generating solution is a photo resist (PR) or an etchant.

3. The apparatus of claim 1, wherein a diameter of the end portion of the container is less than 100 nm.

4. The apparatus of claim 1, wherein said first and second displacement generating units are piezoelectric transducers (PZT).

5. The apparatus of claim 1, wherein said sample moving unit includes a third displacement generating unit for moving the sample in accordance with a control of the controlling unit.

6. The apparatus of claim 5, wherein said third displacement generating unit is a PZT or a transducer.

7. The apparatus of claim 1, wherein said detector includes:
- a laser for emitting a laser beam at the dispensing end portion of the container; and,
- a photo-detector for detecting interruption and transmission of the laser beam passed through the dispensing end portion of the container.

8. The apparatus of claim 1, wherein said controlling unit receives the detection signal from the detector, detects a vibration amplitude of the container, measures the distance between the dispensing end portion of the container, measures the distance between the dispensing end portion of the container and the surface of the sample in accordance with the detected vibration amplitude, outputs a first control signal to the first displacement generating unit for maintaining a certain distance between the dispensing end portion of the container and the surface of the sample, outputs a second control signal to the sample moving unit for moving the sample, and outputs a third control signal to the sample moving unit for moving the sample, and outputs a third control signal to the second displacement generating unit for ejecting the nano-pattern generating solution on the sample.

9. The apparatus of claim 1, wherein said controlling unit stores information concerning a pattern.

10. The apparatus of claim 1, wherein a line width of the pattern is less than 100 nm and is formed in a trench shape or a ridge shape.

11. The apparatus of claim 1, wherein the distance between the dispensing end portion of the container and the surface of the sample is between 20 to 50 nm.

* * * * *